(12) United States Patent
Hayashi (10) Patent No.: US 8,568,554 B2
(45) Date of Patent: Oct. 29, 2013

(54) MOVABLE GAS INTRODUCTION STRUCTURE AND SUBSTRATE PROCESSING APPARATUS HAVING SAME

(75) Inventor: Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1000 days.

(21) Appl. No.: 12/610,747

(22) Filed: Nov. 2, 2009

(65) Prior Publication Data

US 2010/0043975 A1 Feb. 25, 2010

(30) Foreign Application Priority Data

Nov. 6, 2008 (JP) .................... 2008-285792

(51) Int. Cl.
| | | |
|---|---|---|
| *C23C 16/455* | (2006.01) | |
| *C23C 16/50* | (2006.01) | |
| *C23C 16/505* | (2006.01) | |
| *C23C 16/509* | (2006.01) | |
| *C23F 1/00* | (2006.01) | |
| *H01L 21/306* | (2006.01) | |
| *C23C 16/06* | (2006.01) | |
| *C23C 16/22* | (2006.01) | |

(52) U.S. Cl.
USPC .................. 156/345.33; 118/723 E; 118/715; 156/345.44; 156/345.43

(58) Field of Classification Search
USPC ............ 118/715, 723 E; 156/345.43–345.44, 156/345.33
See application file for complete search history.

(56) References Cited

U.S. PATENT DOCUMENTS

| | | | | |
|---|---|---|---|---|
| 3,215,508 A | * | 11/1965 | Piester | 422/143 |
| 4,651,674 A | * | 3/1987 | Hayashi et al. | 118/728 |
| 5,009,738 A | * | 4/1991 | Gruenwald et al. | 156/345.47 |
| 5,232,508 A | * | 8/1993 | Arena et al. | 118/719 |
| 5,238,532 A | * | 8/1993 | Zarowin et al. | 216/67 |
| 5,536,324 A | * | 7/1996 | Fuchita | 118/726 |
| 5,653,479 A | * | 8/1997 | Henderson | 285/261 |
| 5,962,085 A | * | 10/1999 | Hayashi et al. | 427/585 |
| 6,328,221 B1 | * | 12/2001 | Moore et al. | 239/1 |
| 6,347,749 B1 | * | 2/2002 | Moore et al. | 239/1 |
| 6,490,994 B1 | * | 12/2002 | Yoshizawa | 118/723 ER |
| 6,514,348 B2 | * | 2/2003 | Miyamoto | 118/715 |
| 7,807,222 B2 | * | 10/2010 | Kuznetsov | 427/249.15 |
| 7,827,932 B2 | * | 11/2010 | Kojima et al. | 118/723 VE |
| 2004/0050496 A1 | * | 3/2004 | Iwai et al. | 156/345.51 |
| 2004/0134611 A1 | * | 7/2004 | Kato et al. | 156/345.33 |
| 2005/0017310 A1 | * | 1/2005 | Granneman et al. | 257/382 |
| 2005/0056217 A1 | * | 3/2005 | Yamada et al. | 118/715 |
| 2010/0043975 A1 | * | 2/2010 | Hayashi | 156/345.33 |

FOREIGN PATENT DOCUMENTS

| | | | | | |
|---|---|---|---|---|---|
| JP | 2001003175 A | * | 1/2001 | | C23C 16/507 |
| JP | 2003-137200 | | 5/2003 | | |
| JP | 2006049924 A | * | 2/2006 | | |
| JP | 2010114271 A | * | 5/2010 | | |

* cited by examiner

*Primary Examiner* — Rudy Zervigon
(74) *Attorney, Agent, or Firm* — Rothwell, Figg, Ernst & Manbeck, P.C.

(57) ABSTRACT

In a gas introduction structure that is reciprocatingly movable in a predetermined direction, a processing gas introduction system is configured to introduce a processing gas into a processing chamber in which a substrate is subjected to a predetermined processing under a clean atmosphere; and a processing gas supply line is configured to be connected to the processing gas introduction system and an external processing gas supply source to supply the processing gas from the processing gas supply source to the processing gas introduction system, mutual relative positions of the processing gas supply source and the processing gas introduction system being changed. The processing gas supply line includes: a first bendable portion connected to the processing gas supply source; a second bendable portion connected to the processing gas introduction system; and a non-bendable pipe interposed between the first bendable portion and the second bendable portion.

12 Claims, 6 Drawing Sheets

MOVABLE GAS INTRODUCTION STRUCTURE AND SUBSTRATE PROCESSING APPARATUS HAVING SAME

CROSS-REFERENCE TO RELATED APPLICATIONS

This application claims priority to Japanese Patent Application No. 2008-285792 filed on Nov. 6, 2008, the entire contents of which are incorporated herein by reference.

FIELD OF THE INVENTION

The present invention relates to a movable gas introduction structure and a substrate processing apparatus having same; and, more particularly, to a movable gas introduction structure including a processing gas supply line that is connected to a fixed gas supply source and a substrate processing apparatus having same.

BACKGROUND OF THE INVENTION

A substrate processing apparatus, in which a substrate, i.e., a semiconductor wafer, is subjected to a plasma processing, includes: a chamber for accommodating the wafer therein and being capable of lowering the pressure inside the chamber; a susceptor (mounting table) arranged at a lower portion of the chamber; and a shower head arranged to face the mounting table in the chamber. The wafer is mounted on the susceptor which is connected to a high frequency power supply to serve as an electrode for supplying a high frequency power to the chamber. The shower head through which a processing gas is supplied to the chamber is grounded to serve as a ground electrode. In the substrate processing apparatus, the processing gas supplied to the chamber is excited by the high frequency power to generate a plasma and the wafer is subjected to the plasma processing by the plasma.

Meanwhile, a susceptor of a conventional substrate processing apparatus has been developed to be movable in order to make adequate distribution of the plasma in the chamber, especially, a space between the shower head and the susceptor. In the substrate processing apparatus, the susceptor is movably configured to adjust a width (hereinafter, referred to as a gap) of the space between the shower head and the susceptor. Moreover, a substrate processing apparatus including a movable shower head, instead of the movable susceptor, has recently been suggested to overcome the layout restriction on peripheral parts of the conventional substrate processing apparatus.

Figure 4:
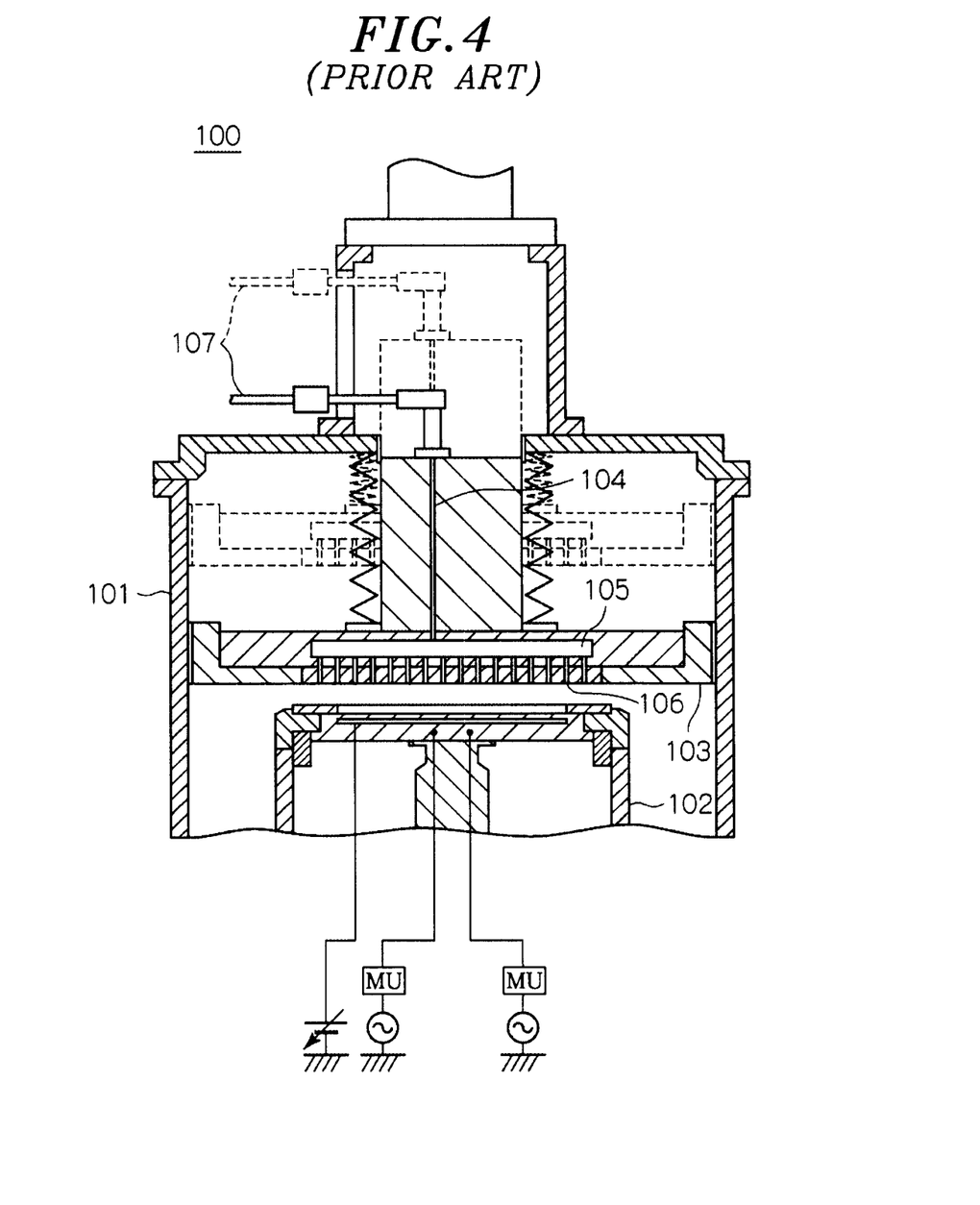
FIG. 4 is a schematic cross sectional view showing a structure of a conventional substrate processing apparatus including a movable shower head.

FIG. 4 is a schematic cross sectional view showing a structure of a substrate processing apparatus 100 including a movable shower head 103.

In the substrate processing apparatus 100 shown in FIG. 4, the shower head 103, which is arranged to face a susceptor 102 inside a cylindrical chamber 101, is of a substantially circular plate shape having an outer diameter that is substantially identical with an inner diameter of the chamber 101. The shower head 103 is upwardly and downwardly moved along an inner wall of the chamber 101 by a lifting unit (not shown) like a piston. In FIG. 4, the shower head 103 placed at a lowermost position and that at an uppermost position are shown in a solid line and a dotted line, respectively.

The shower head 103 includes: a processing gas introduction system having a gas flow path 104, a buffer chamber 105, and gas holes 106; and a gas supply line 107 connected to a gas supply source (not shown) for supplying a processing gas from an outside to the processing gas introduction system. As described above, since the shower head 103 is upwardly and downwardly moved while the gas supply source is typically fixed, it is necessary that the gas supply pipe 107 be bendable to follow the upward and downward movement of the shower head 103.

Typically, a flexible tube is known as a supply pipe for supplying a fluid from a fixed fluid supply source to a movable structure. In a space simulator, for example, the flexible tube is employed as a flexible insulating line for supplying liquid nitrogen from a vacuum vessel to a shroud of a movable door. (see, e.g., Japanese Patent Laid-open publication No. 2003-137200)

Figure 5:
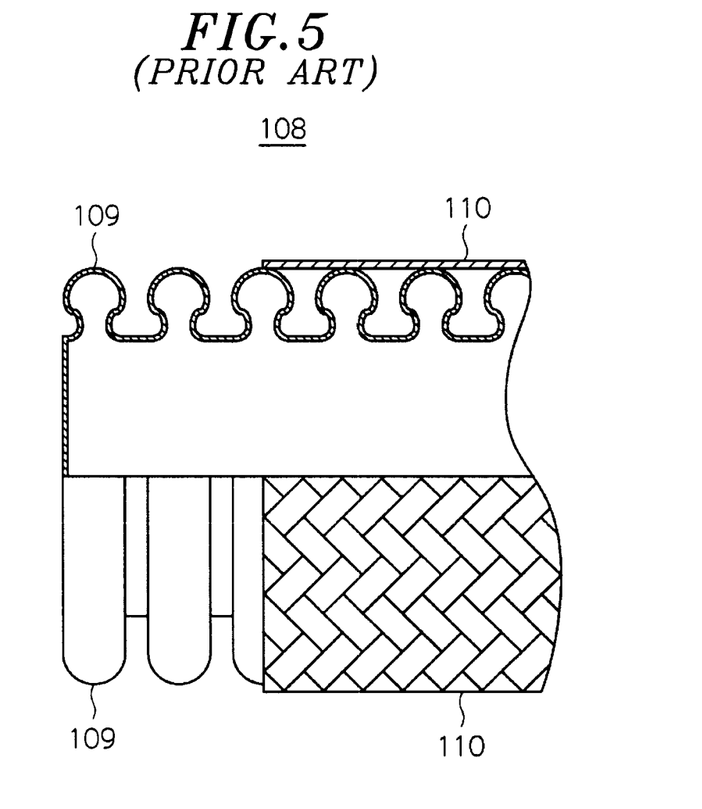
FIG. 5 is a partially enlarged view showing a conventional flexible tube.

However, as shown in FIG. 5, since a flexible tube 108 is formed of a thin wavy metal pipe 109 fabricated by a drawing process and a metal mesh blade 110 covering a peripheral portion of the metal pipe 109, the flexible tube 108 has a relatively low flexibility and a relatively high stiffness against bending. Accordingly, when the flexible tube 108 is extensively bent, a high stress is easily generated. Moreover, when the flexible tube 108 is applied to a structure that is movable by a large displacement, it is likely that the flexible tube 108 can be broken early to thereby shorten its life span. As a result, it is difficult to apply the flexible tube 108 to the shower head 103 that is frequently vertically movable by a large displacement of 70 mm.

Figure 6:
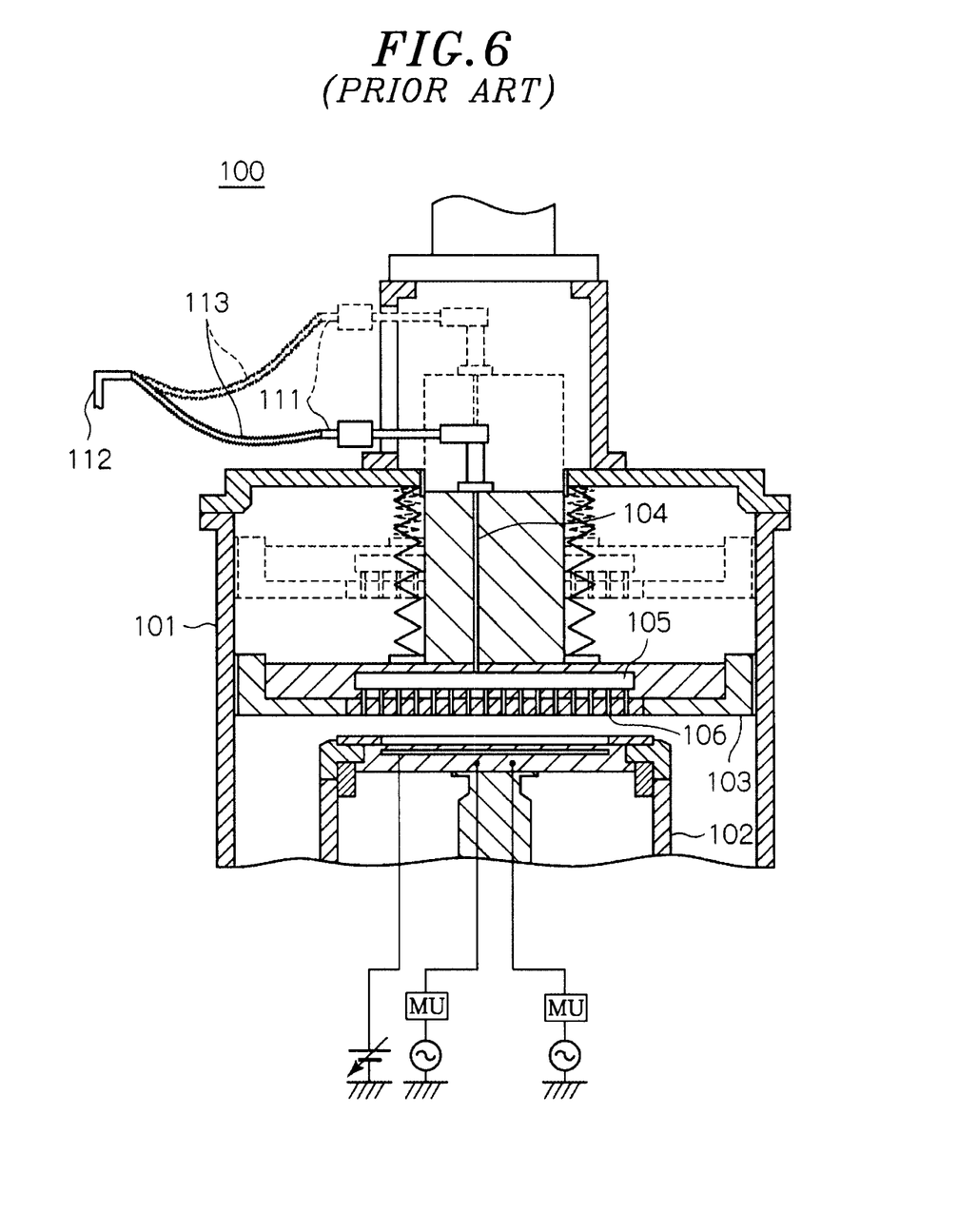
FIG. 6 is a schematic cross sectional view showing a modified structure of the conventional substrate processing apparatus shown in FIG. 4.

For that reason, as shown in FIG. 6, it has been suggested to employ a bellows 113 connected to a gas receiving part 111 joined to the shower head 103 and a fixed gas supply source 112 separated from the substrate processing apparatus 100.

The bellows 113 is made of only a metal pipe in which a plurality of ring-shaped members (hereinafter, referred to pieces) having mountain shaped cross sections are connected to one another. Accordingly, the bellows 113 has a relatively high flexibility and a relatively low stiffness against bending. Therefore, even though the bellows 113 is applied to the shower head 103 that is frequently extensibly displaceable, no high stress is generated in the bellows 113 and thus the flexible tube 108 is not broken early to thereby shorten its life span.

However, even nano-sized particles cannot be allowed to be present in the chamber 101 of the substrate processing apparatus 100. Accordingly, it is necessary to reduce the particle generation probability as low as possible.

In the bellows 113, each of the pieces is fabricated by welding two metal rings. When the bellows 113 is bent, the relative positions of the two metal rings of each of the pieces are changed. Accordingly, particles are easily generated. The generated particles may be introduced into the processing gas introduction system of the shower head 103 through the bellows 113. Specially, as the bellows 113 is longer, the particle generation probability gets greater.

Moreover, the bellows 113 may droop extensively due to the high flexibility for bending. The extensively drooping bellows 113 may also be interfered with other structures of the substrate processing apparatus 100. Accordingly, it is necessary to provide a guide for controlling the droop, thereby lowering the freedom of arrangement.

SUMMARY OF THE INVENTION

In view of the above, the present invention provides a movable gas introduction structure and a substrate processing apparatus having same that can substantially reduce the particle generation probability and also acquire a high freedom of arrangement.

In accordance with an aspect of the present invention, there is provided a gas introduction structure that is reciprocatingly movable in a predetermined direction, including: a processing gas introduction system configured to introduce a processing gas into a processing chamber in which a substrate is subjected to a predetermined processing under a clean atmosphere; and a processing gas supply line configured to be connected to the processing gas introduction system and an external processing gas supply source to supply the processing gas from the processing gas supply source to the processing gas introduction system, mutual relative positions of the processing gas supply source and the processing gas introduction system being changed. The processing gas supply line includes: a first bendable portion connected to the processing gas supply source; a second bendable portion connected to the processing gas introduction system; and a non-bendable pipe interposed between the first bendable portion and the second bendable portion.

In accordance with another aspect of the present invention, there is provided a substrate processing apparatus, including: a gas introduction structure configured to be reciprocatingly movable in a predetermined direction; and a processing chamber in which a substrate is subjected to a predetermined processing under a clean atmosphere. The gas introduction structure includes: a processing gas introduction system configured to introduce a processing gas into the processing chamber; and a processing gas supply line configured to be connected to the processing gas introduction system and an external processing gas supply source to supply the processing gas from the processing gas supply source to the processing gas introduction system, mutual relative positions of the processing gas supply source and the processing gas introduction system being changed, and the processing gas supply line includes: a first bendable portion connected to the processing gas supply source; a second bendable portion connected to the processing gas introduction system; and a non-bendable pipe interposed between the first bendable portion and the second bendable portion.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

An embodiment of the present invention will now be described with reference to the accompanying drawings which form a part hereof.

Figure 1:
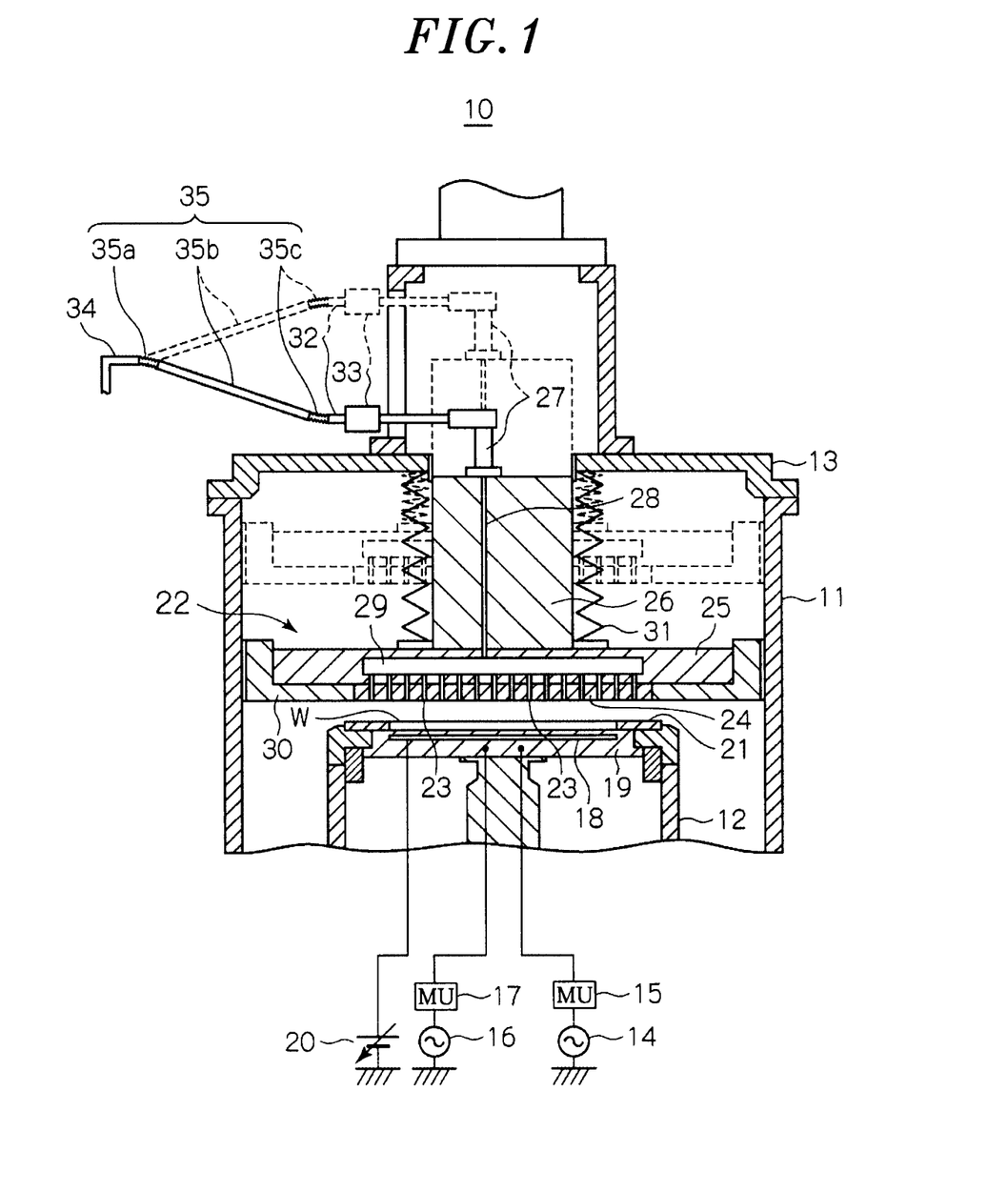
FIG. 1 is a schematic cross sectional view showing a structure of a substrate processing apparatus including a movable gas introduction structure in accordance with an embodiment of the present invention.

FIG. 1 is a schematic cross sectional view showing a structure of a substrate processing apparatus 10 including a movable gas introduction structure in accordance with an embodiment of the present invention. The substrate processing apparatus 10 is configured to subject a wafer to an etching processing.

In FIG. 1, the substrate processing apparatus 10 includes: a cylindrical chamber (processing chamber) 11 configured to accommodate a wafer W having a diameter of, e.g., 300 mm therein; a cylindrical susceptor (mounting table) 12 arranged at a lower portion of the chamber 11 and mounting the wafer W for semiconductor devices; and an openable cylindrical cover unit 13 configured to cover an upper portion of the chamber 11.

The pressure inside the chamber 11 is lowered by a turbo molecular pump (TMP) (not shown), a dry pump (DP) (not shown), or the like and controlled by an automatic pressure control (APC) valve (not shown). Moreover, since a defect can be caused by the attachment of nano-sized particles to a semiconductor device, a cleaning process is performed inside the chamber 11, prior to the dry etching process, to remove the particles.

A first and a second high frequency power supply 14 and 16 are connected to the susceptor 12 via a first and a second matching unit (MU) 15 and 17, respectively. The first high frequency power supply 14 supplies a bias power, i.e., a high frequency power of a relatively low frequency, e.g., 3.2 MHz to the susceptor 12 and the second high frequency power supply 16 supplies a plasma generation power, i.e., a high frequency power of a relatively high frequency, e.g., 40 MHz to the susceptor 12. The plasma generation power is supplied from the susceptor 12 to the chamber 11.

An electrostatic chuck 19 is arranged at an upper part of the susceptor 12 and an electrostatic electrode plate 18 is included inside the electrostatic chuck 19. The electrostatic chuck 19 is made of a cylindrical ceramic member and a DC power supply 20 is connected to the electrostatic electrode plate 18. If a positive DC voltage is supplied to the electrostatic electrode plate 18, a negative potential is generated on a surface (on the side of the electrostatic chuck 19) of the wafer W (hereinafter, referred to as a back surface of the wafer W), thereby developing a potential difference between the electrostatic electrode plate 18 and the back surface of the wafer W. As a result, the wafer W is attracted to and held by the electrostatic chuck 19 under the action of a Coulomb force or a Johnson-Rahbek force generated by the potential difference.

A ring-shaped member, i.e., a focus ring 21 is mounted on the susceptor 12 to surround the held wafer W. The focus ring 21 is made of a conductor, e.g., a single crystalline silicon that is identical to the material of the wafer W. Since the focus ring 21 is made of a conductor, the plasma on the wafer W is extended to the focus ring 21 the wafer W and thus the density of the plasma around a peripheral portion is maintained to be identical to that of the plasma at a center portion of the wafer W. Accordingly, it is possible to maintain the uniformity of the dry etching process throughout a whole surface of the wafer W.

In the cover unit 13 of the substrate processing apparatus 10, a shower head 22 is arranged to face the susceptor 12. The shower head 22 includes: a conductive upper electrode plate 24 having a plurality of gas holes 23; a cooling plate 25 configured to detachably hold the upper electrode plate 24; a shaft 26 configured to hold the cooling plate 25; and a processing gas receiving part 27 arranged on a top end portion of the shaft 26. The upper electrode plate 24 is grounded and serves as a ground electrode (facing electrode) for the plasma generation power supplied to the chamber 11.

A gas flow path 28 extends through the shaft 26 in a vertical direction as shown in FIG. 1 and a buffer chamber 29 is included inside the cooling plate 25. The gas flow path 28 is connected to the processing gas receiving part 27 and the buffer chamber 29. The processing gas receiving part 27, the gas flow path 28, and the buffer chamber 29 are included in a processing gas introduction system. The processing gas introduction system introduces into the chamber 11 a processing gas supplied to the processing gas receiving part 27.

In the shower head 22, a ring-shaped member, i.e., an insulator ring 30 is arranged to envelop a peripheral portion of the upper electrode plate 24. An outer diameter of the insulator ring 30 is substantially identical to an inner diameter of the chamber 11 and the insulator ring 30 is arranged to slide along an inner wall of the chamber 11. The shaft 26 extends through the cover unit 13 and an upper portion of the shaft 26 is connected to a lift unit (not shown) arranged at an upper portion of the substrate processing apparatus 10. The lift unit moves the shaft 26 upwardly and downwardly in a vertical direction shown in FIG. 1.

When the shaft 26 is moved upwardly and downwardly, the shower head 22, especially, the insulator ring 30 and the upper electrode plate 24 are moved upwardly and downwardly like a piston in the chamber 11. Accordingly, it is possible to adjust a gap, i.e., the width of a space between the shower head 22 and the susceptor 12. In FIG. 1, the shower head 22 placed at a lowermost position and that at an uppermost position are shown in a solid line and a dotted line, respectively. The maximum moving amount of the shower head 22 that is movable in the vertical direction in FIG. 1 is about 70 mm, for example.

It is likely that the shaft 26 grazes the cover unit 13 and thus particles may be generated. Accordingly, the bellows 31 covers a side surface of the shaft 26. The bellows 31 also seals off the inside of the chamber 11 from the outside thereof.

In the substrate processing apparatus 10, the processing gas supplied to the processing gas receiving part 27 is introduced into the chamber 11 via the processing gas introduction system after a cleaning process is performed in the chamber 11. Then, the introduced processing gas is excited by the plasma generation power supplied to the chamber 11 to be converted into a plasma. Positive ions in the plasma are attracted toward the wafer W mounted on the susceptor 12 by a negative bias potential caused by the bias power supplied to the susceptor 12, thereby being used to subject the wafer W to the dry etching process.

The operations of various components (e.g., the first and the second high frequency power supply 14 and 16) of the substrate processing apparatus 10 are controlled by a program related to the dry etching process performed by a central processing unit (CPU) of a controller (not shown) included in the substrate processing apparatus 10.

An extending pipe 32 is connected to the processing gas receiving part 27 of the shower head 22 and extends toward an outside. A filter 33 is installed in the extending pipe 32 to filter off a small quantity small-sized particles included in the processing gas which flows though the extending pipe 32. The extending pipe 32 is also connected to a tube-shaped processing gas supply source 34 via a processing gas supply line 35. The processing gas supply source 34 is fixably joined to a frame (not shown) for fixing the substrate processing apparatus 10 in the outside of the substrate processing apparatus 10.

The processing gas supply line 35 includes: first bellows (first bendable portion) 35*a* connected to the processing gas supply 34; second bellows (second bendable portion) 35*c* connected to the processing gas introduction system via the extending pipe 32; and a metallic tube (non-bendable pipe) 35*b* interposed between the first and the second bellows 35*a* and 35*c*. The length of the processing gas supply line 35 is set to be equal to or greater than the diameter of the chamber 11.

Figure 2:
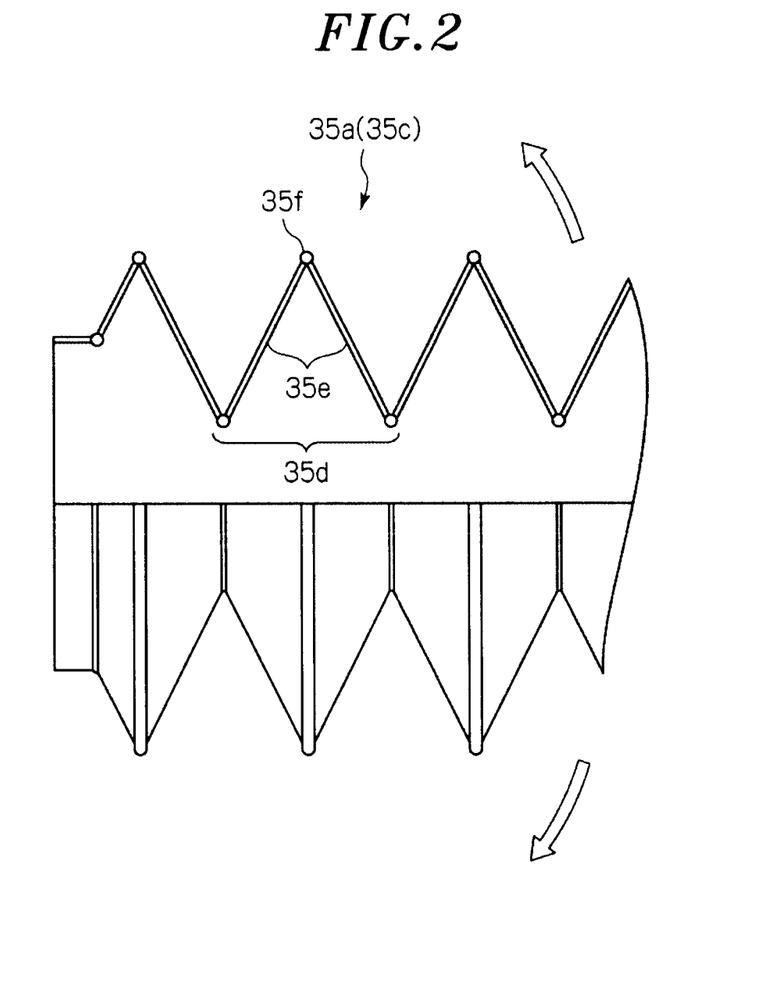
FIG. 2 is a partially enlarged view showing one example of a first (second) bellows of a processing gas supply line shown in FIG. 1.

FIG. 2 is a partially enlarged view showing one example of the first bellows 35*a* (second bellows 35*c*) of the processing gas supply line 35 shown in FIG. 1. In FIG. 2, an upper half region shows a cross sectional view of the first bellows 35*a* (second bellows 35*c*) and a lower half region shows a side view thereof.

In FIG. 2, the first bellows 35*a* (second bellows 35*c*) is made of a metal pipe in which a plurality of ring-shaped members (hereinafter, referred to pieces) 35*d* each having a mountain shaped vertical cross section (a cross section in the length direction of the first bellows 35*a* (second bellows 35*c*)) are connected to one another in the length direction of the first bellows 35*a* (second bellows 35*c*). The pieces 35*d*, each of which formed by two metal ring plates 35*e* in a taper shape, are connected to one another by welding their bottom ends. In other words, the vertex of the mountain shaped cross section of each piece 35*d* is a welded part 35*f*, so that the first bellows 35*a* (second bellows 35*c*) has a high flexibility and a low stiffness against the bending in directions pointed by arrows shown in FIG. 2 and thus the first bellows 35*a* (second bellows 35*c*) is easily bendable in the arrow-pointed directions.

Further, since the pieces 35*d* are connected to one another in the length direction of the first bellows 35*a* (second bellows 35*c*), the displacements of the pieces 35*d* can be summed to deal with the lengthwise directional (arrow-pointed directional) bending. Accordingly, the first bellows 35*a* (second bellows 35*c*) can be employed to deal with extensive lengthwise-directional bending.

Further, since each piece 35*d* has a ring-shaped cross section taken in a direction perpendicular to the length direction and each piece 35*d* is made of the metal ring plates 35*e*, the first bellows 35*a* (second bellows 35*c*) can hardly be distorted. Accordingly, once the first bellows 35*a* (second bellows 35*c*) starts to be bent, the first bellows 35*a* (second bellows 35*c*) can be bent only in one direction.

In FIG. 1, when the shower head 22 is moved in the vertical direction, mutual relative positions of the processing gas receiving part 27 (extending pipe 32) and the processing gas supply source 34 are changed. However, since the first and the second bellows 35*a* and 35*c* are respectively bent and thus the inclined angle of the metallic tube 35*b* can be changed, the processing gas supply line 35 can absolve the changes in the mutual relative positions to follow the vertical movement of the shower head 22.

As a result, even though the shower head 22 is moved in the vertical direction in FIG. 1, the processing gas supply line 35 can be used to connect the processing gas supply source 34 to the extending pipe 32 and further the processing gas introduction system, so that the processing gas can be supplied all the time. Moreover, since bendable portions exist in the first and the second bellows 35*a* and 35*c* only and no bendable portion exists in the metallic tube 35*b*, the processing gas supply line 35 may not largely droop.

For the shower head 22 as the movable introduction structure in accordance with the present embodiment, the processing gas supply line 35 includes: the first bellows 35*a* connected to the processing gas supply source 34; the second bellows 35*c* connected to the processing gas introduction system; and the metallic tube 35*b* interposed between the first and the second bellows 35*a* and 35*c*. Accordingly, it is possible to employ the first and the second bellows 35*a* and 35*c* having relatively short lengths, thereby substantially reducing the particle generation probability. Moreover, it becomes unnecessary to provide a guide by preventing the droop of the processing gas supply line 35. As a result, the freedom of arrangement can be acquired.

In the first bellows 35a (second bellows 35c), each of the pieces 35d is formed by welding two corresponding metal ring plates 35e. This seems to require much times and costs in the manufacturing. However, as described above, since the first and the second bellows 35a and 35c having relatively short lengths can be employed in the processing gas supply line 35, it is possible to prevent the increase in the cost of the processing gas supply line 35 and further the increase in the cost of the shower head 22.

Since the first bellows 35a (second bellows 35c) has the high flexibility for bending or no high stress is generated when the first bellows 35a (second bellows 35c) is bent, it is possible to prevent the processing gas supply line 35 from being broken early to shorten its life span. The first bellows 35a (second bellows 35c) is not distorted as well. Accordingly, it is possible to prevent the processing gas supply line 35 from being bent in another direction. Moreover, the lengths of such bendable portions can be made to be minimized, thereby making a guide unnecessary.

In the shower head 22, since the length of the processing gas supply line 35 is set to be equal to or greater than the diameter of the chamber 11, it is possible to employ the metallic tube 35b having a relatively long length. Moreover, when the shower head 22 is vertically moved, the change in the inclined angle of the metallic tube 35b can be reduced, to thereby decrease the bending levels of the first and the second bellows 35a and 35c. Accordingly, it is possible to further suppress a stress from being generated in the processing gas supply line 35.

Even though the processing gas receiving part 27 is arranged near a center portion of the shower head 22, one end portion (first bellows 35a) and another end portion (second bellows 35c) can be connected to the processing gas supply line 34 and the processing gas receiving part 27, respectively, to thereby arrange the processing gas introduction system near a center axis of the chamber 11. Accordingly, the processing gas can be easily introduced from a portion near the center of the shower head 22 to the chamber 11.

As described above, since the first bellows 35a (second bellows 35c) is hardly likely to be distorted, if a large distortion moment is applied from an outside, the metal ring plates of the respective ring plates 35d may give up. As a result, the flexibility of the first bellows 35a (second bellows 35c) may be lowered. However, since the shower head 22 is movable only in the vertical direction, the first bellows 35a (second bellows 35c) will be bent only in the vertical direction and need not be distorted. Accordingly, in the shower head 22, the flexibility of the first bellows 35a (second bellows 35c) is not lowered.

Figure 3:
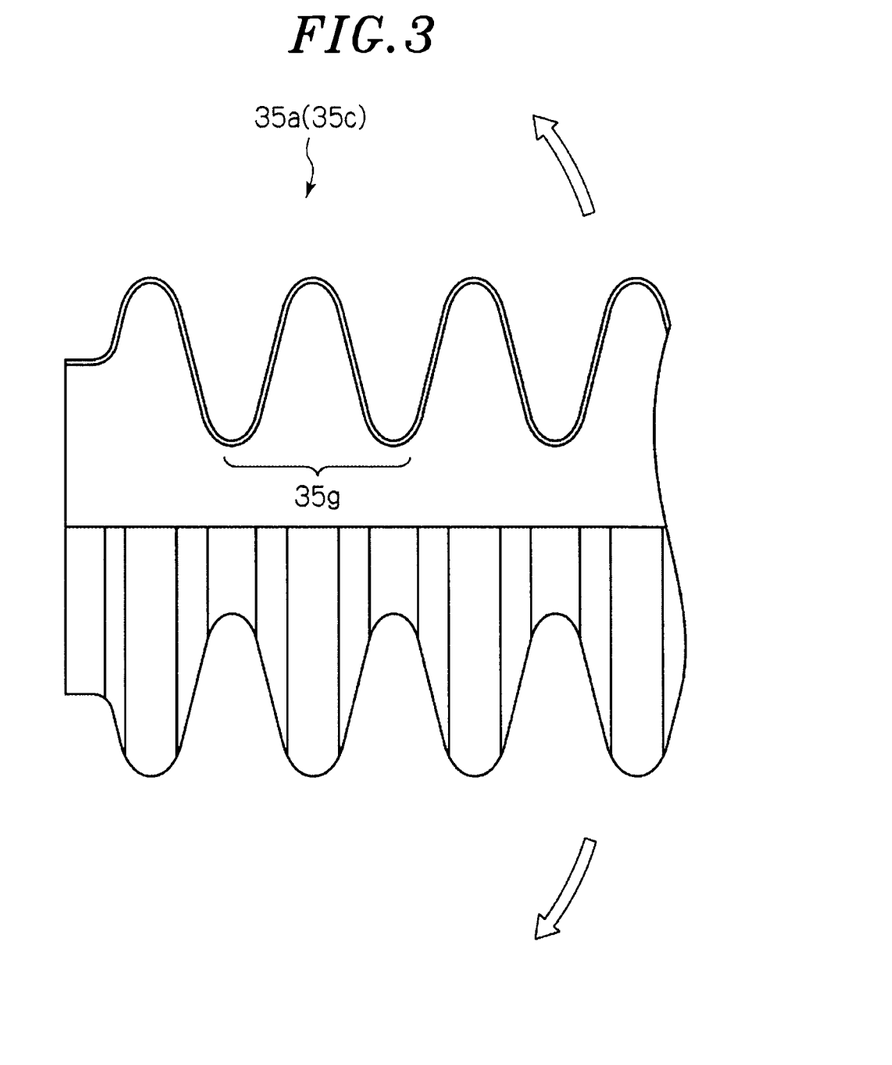
FIG. 3 is a partially enlarged view showing another example of a first (second) bellows of a processing gas supply line shown in FIG. 1.

In the processing gas supply line 35 of the shower head 22, the respective pieces 35d of the first bellows 35a (second bellows 35c) are formed by welding two corresponding ring plates 35e. Alternatively, as shown in FIG. 3, each of the pieces 35d may be formed by subjecting a thin metal pipe to a drawing process, a fluid pressure forming, or a roll forming. As compared with a case of using the welding process, the respective pieces 35d can be more easily formed by using the drawing process, the fluid pressure forming, or the roll forming. Accordingly, it is possible to prevent the increase in the cost of the processing gas supply line 35 and further the increase in the cost of the shower head 22.

In accordance with the present embodiment, the shower head 22 is arranged at an upper portion of the chamber 11 and movable in the vertical direction. However, the present invention is applicable to the case that the susceptor 12 is arranged at a lower portion of the chamber 11 and movable in the vertical direction. Specifically, when the susceptor 12 is movable in the vertical direction and a gas is required to be supplied from an outside to the susceptor 12, a gas supply line having a similar structure to that of the processing gas supply line 35 may be employed to connect a gas receiving part of the susceptor to an external gas supply source.

Moreover, the processing gas supply source 34 is immovably joined to the frame in accordance with the present embodiment. However, even though the processing gas supply source is movable, when mutual relative positions of the gas supply source and the processing gas receiving part are changed, the present invention can be applied, to thereby yield the same effect as that of the present embodiment.

Further, it is not necessary that the pressure inside the chamber 11 be reduced and a plasma be generated inside the chamber 11. The present invention can be applied, to thereby yield the same effect as that of the present embodiment when a gas is supplied from an outside to the chamber 11 via a movable gas introduction structure while the inside of the chamber is maintained under a clean atmosphere.

Finally, the substrate subjected to the dry etching process is a wafer for making semiconductor devices in the present embodiment. However, the substrate to be etched is not limited to the present embodiment. For example, the substrate may be a glass substrate for use in a liquid crystal display (LCD) or a flat panel display (FPD).

While the invention has been shown and described with respect to the embodiments, it will be understood by those skilled in the art that various changes and modification may be made without departing from the scope of the invention as defined in the following claims.

What is claimed is:

1. A gas introduction structure that is reciprocatingly movable in a predetermined direction, comprising:
    a processing gas introduction system configured to introduce a processing gas into a processing chamber in which a substrate is subjected to a predetermined processing under a clean atmosphere; and
    a processing gas supply line connected to the processing gas introduction system and to an external processing gas supply source to supply the processing gas from the processing gas supply source to the processing gas introduction system, wherein mutual relative positions of the processing gas supply source and the processing gas introduction system are configured to be changed,
    wherein the processing gas supply line includes: a first bendable portion connected to the processing gas supply source; a second bendable portion connected to the processing gas introduction system; and a non-bendable pipe interposed between the first bendable portion and the second bendable portion, and
    wherein an inclined angle of the non-bendable pipe is changed with bending of the first bendable portion or the second bendable portion.

2. The structure of claim 1, wherein each of the first bendable portion and the second bendable portion is a bellows.

3. The structure of claim 1, wherein the processing chamber has a cylindrical shape and a length of the processing gas supply line is equal to or greater than a radius of the processing chamber.

4. The structure of claim 2, wherein the processing chamber has a cylindrical shape and a length of the processing gas supply line is equal to or greater than a radius of the processing chamber.

5. A substrate processing apparatus, comprising:
a gas introduction structure configured to be reciprocatingly movable in a predetermined direction; and
a processing chamber in which a substrate is subjected to a predetermined processing under a clean atmosphere,
wherein the gas introduction structure includes:
a processing gas introduction system configured to introduce a processing gas into the processing chamber; and
a processing gas supply line connected to the processing gas introduction system and to an external processing gas supply source to supply the processing gas from the processing gas supply source to the processing gas introduction system, wherein mutual relative positions of the processing gas supply source and the processing gas introduction system are configured to be changed,
wherein the processing gas supply line includes: a first bendable portion connected to the processing gas supply source; a second bendable portion connected to the processing gas introduction system; and a non-bendable pipe interposed between the first bendable portion and the second bendable portion, and
wherein an inclined angle of the non-bendable pipe is changed with bending of the first bendable portion or the second bendable portion.

6. The apparatus of claim 5, further comprising: a mounting table arranged inside the processing chamber to mount the substrate thereon and connected to a high frequency power supply to serve as an electrode for supplying a high frequency power to the processing chamber,
wherein the gas introduction structure is moveable toward and away from the mounting table and is arranged to face the mounting table to serve as a facing electrode.

7. The structure of claim 1, wherein a filter is disposed between the second bendable portion and the processing gas introduction system to filter particles.

8. The apparatus of claim 5, wherein a filter is disposed between the second bendable portion and the processing gas introduction system to filter particles.

9. The structure of claim 1, wherein the first bendable portion is directly connected to the external processing gas supply source.

10. The apparatus of claim 5, wherein the first bendable portion is directly connected to the external processing gas supply source.

11. The structure of claim 3, wherein the length of the processing gas supply line is equal to a sum of a length of the first bendable portion, a length of the second bendable portion, and a length of the non-bendable pipe interposed between the first bendable portion and the second bendable portion.

12. The structure of claim 4, wherein the length of the processing gas supply line is equal to a sum of a length of the first bendable portion, a length of the second bendable portion, and a length of the non-bendable pipe interposed between the first bendable portion and the second bendable portion.

* * * * *